United States Patent
Tu et al.

(10) Patent No.: US 8,441,086 B2
(45) Date of Patent: May 14, 2013

(54) IMAGE SENSOR PACKAGING STRUCTURE WITH PREDETERMINED FOCAL LENGTH

(75) Inventors: Hsiu-Wen Tu, Hsin-Chu Hsien (TW); Chung-Hsien Hsin, Hsin-Chu Hsien (TW); Chun-Hua Chuang, Hsin-Chu Hsien (TW); Ren-Long Kuo, Hsin-Chu Hsien (TW); Chin-Fu Lin, Hsin-Chu Hsien (TW); Young-Houng Shiao, Hsin-Chu Hsien (TW)

(73) Assignee: Kingpak Technology Inc., Hsin-Chu Hsien (TW)

( * ) Notice: Subject to any disclaimer, the term of this patent is extended or adjusted under 35 U.S.C. 154(b) by 214 days.

(21) Appl. No.: 12/947,210

(22) Filed: Nov. 16, 2010

(65) Prior Publication Data
US 2011/0156187 A1    Jun. 30, 2011

(30) Foreign Application Priority Data
Dec. 31, 2009    (TW) ................................ 98146153 A (51) Int. Cl.
*H01L 31/0232*    (2006.01)
(52) U.S. Cl.
USPC ........................................................ 257/432
(58) Field of Classification Search .................. 257/432, 257/434
See application file for complete search history.

(56) References Cited

U.S. PATENT DOCUMENTS

| | | | |
|---|---|---|---|
| 6,849,915 B1 * | 2/2005 | Tsai .............................. | 257/432 |
| 6,972,497 B2 | 12/2005 | Prior | |
| 2004/0065952 A1 * | 4/2004 | Prior ............................. | 257/724 |
| 2004/0251509 A1 * | 12/2004 | Choi ............................ | 257/432 |
| 2006/0091487 A1 * | 5/2006 | Hanada et al. ................ | 257/432 |
| 2006/0202293 A1 * | 9/2006 | Bogdan et al. ............... | 257/432 |
| 2008/0203512 A1 * | 8/2008 | Webster et al. ............... | 257/434 |
| 2008/0296715 A1 * | 12/2008 | Kumata et al. ............... | 257/432 |
| 2008/0296718 A1 * | 12/2008 | Kumata et al. ............... | 257/434 |
| 2009/0068798 A1 | 3/2009 | Oliver et al. | |
| 2009/0206431 A1 * | 8/2009 | Bolken et al. ................ | 257/432 |
| 2010/0314703 A1 * | 12/2010 | Chen ............................ | 257/432 |
| 2011/0031510 A1 * | 2/2011 | Rossi et al. .................... | 257/88 |

FOREIGN PATENT DOCUMENTS

| | | |
|---|---|---|
| EP | 1 659 781 A1 | 5/2006 |
| EP | 1 786 033 A2 | 5/2007 |
| EP | 2 280 415 A2 | 2/2011 |
| WO | WO 2008/132980 A1 | 11/2008 |

OTHER PUBLICATIONS

Extended European Search Report for Application No. 10187111.9-2203 / 2341541, dated Jul. 10, 2012, pp. 1-14.

* cited by examiner

*Primary Examiner* — Jae Lee
*Assistant Examiner* — Grant Withers
(74) *Attorney, Agent, or Firm* — Juan Carlos A. Marquez (57) ABSTRACT

An image sensor packaging structure with a predetermined focal length is provided. The image sensor packaging structure includes a substrate, a chip, an optical assembly, and an encapsulation compound. The chip has a sensitization area and is coupled to the substrate. Conductive contacts on the substrate are electrically connected with conductive contacts around the sensitization area. The optical assembly has the predetermined focal length and is disposed above the chip so as to form an air cavity between the optical assembly and the sensitization area of the chip. The encapsulation compound is formed on the substrate to surround the chip and the optical assembly. With the above stated structure, not only can the focus adjusting procedure be dispensed with, but also the image sensor packaging structure can be manufactured by a molding or dispensing process.

4 Claims, 14 Drawing Sheets

IMAGE SENSOR PACKAGING STRUCTURE WITH PREDETERMINED FOCAL LENGTH

BACKGROUND OF THE INVENTION

1. Technical Field

The present invention relates to an image sensor packaging structure and, more particularly, to an image sensor packaging structure having a predetermined focal length and equipped with an optical assembly which is assembled, tested, and calibrated in advance.

2. Description of Related Art

Image sensors are configured to receive light in the surrounding space and convert optical signals into electrical signals and are therefore widely used as a key component in a variety of photoelectric products. A conventional image sensor packaging structure is typically made in the following manner. An image sensor chip is disposed on a substrate and electrically connected thereto by conductive wires. Then, a light-transparent lid or a lens set is provided above the image sensor chip such that light passing through the light-transparent lid or the lens set can be captured by the image sensor chip. After packaging, the resultant image sensor packaging structure is ready for use by a system manufacturer. For example the image sensor packaging structure can be integrated into an external device, such as a printed circuit board, and applied to a digital still camera (DSC), a digital video recorder (DV), a surveillance device, a cell phone, an image sensor module for vehicles, and many other electronic products.

In order to satisfy consumers' demands of electronic products, manufacturers have spared no effort in downsizing the image sensor packaging structure and simplifying its packaging process. For instance, referring to FIG. 1 for an image sensor packaging structure disclosed by U.S. Pat. No. 6,972,497, which is entitled "Optical Semiconductor Device and Method of Manufacture" and granted on Dec. 6, 2005, a sensor chip 1 is provided with conductive wires 2 for electrically connecting the sensor chip 1 to an underlying substrate or carrier. Then, a supporting member 3 is provided above the sensor chip 1, and a dam 4 is formed around and at some distance from the sensor chip 1. Afterward, a polymer encapsulation 5, made of epoxy for example, is used to embed the conductive wires 2, before a lens holder 6 is provided on the supporting member 3.

Figure 1:
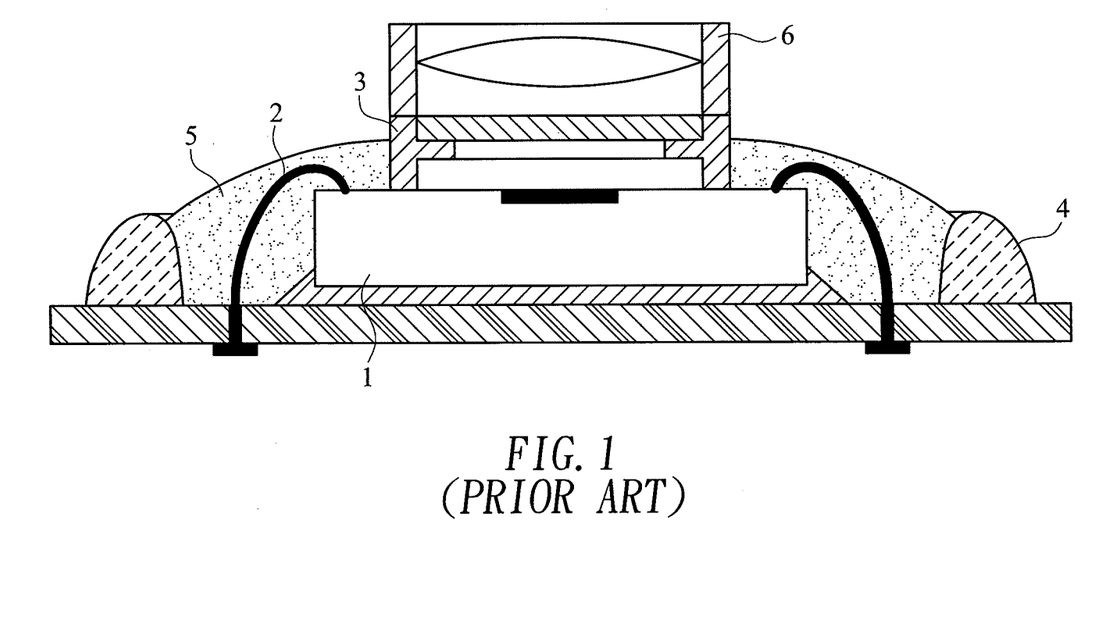
FIG. 1 is a sectional view of a conventional image sensor packaging structure.

The image sensor packaging structure of the above-cited US patent has the following drawbacks. First of all, the manufacturing method is complicated. Secondly, the supporting member 3 incurs high production costs and material costs. Thirdly, the polymer encapsulation 5 has high material costs and low productivity. Fourthly, the assembly tolerances between the sensor chip 1 and the supporting member 3 and between the supporting member 3 and the lens holder 6 are so large that it is structurally difficult to provide a predetermined focal length More specifically, the optical assembly tends not to focus on the sensitization area of the image sensor but to cause an out-of-focus phenomenon. Last but not least, since each image sensor must be tested and calibrated individually, the time and costs required for the entire manufacturing process are increased. As a result, the cycle time of the manufacturing process cannot be effectively shortened, which in turn hinders improvement in throughput per unit time.

BRIEF SUMMARY OF THE INVENTION

It is an object of the present invention to provide an image sensor packaging structure with a predetermined focal length, wherein an optical assembly is assembled and tested in advance to provide the predetermined focal length. The optical assembly can then focus on a sensitization area of the image sensor more readily, thus preventing the out-of-focus phenomenon which may otherwise result from the unduly large mechanical assembly tolerances in the prior art.

It is another object of the present invention to provide an image sensor packaging structure with a predetermined focal length, wherein an optical assembly is assembled and tested in advance, so a focus adjusting procedure can be dispensed with. As the manufacturing process is simplified, the time and costs of the manufacturing process are both reduced.

It is still another object of the present invention to provide an image sensor packaging structure with a predetermined focal length, wherein the image sensor packaging structure can be made by a molding process. Thus, the cycle time of the manufacturing process can be significantly shortened to increase the throughput per unit time.

It is yet another object of the present invention to provide an image sensor packaging structure with a predetermined focal length, wherein the image sensor packaging structure can be made by a molding process and is hence suitable for batch-type mass-production, which helps reduce production costs.

To achieve the foregoing objects, the present invention provides an image sensor packaging structure with a predetermined focal length, wherein the image sensor packaging structure includes a substrate, a chip, an optical assembly, and an encapsulation compound. The substrate has a supporting surface and a bottom surface, wherein the supporting surface is formed with a plurality of first conductive contacts. The chip has a first surface coupled to the supporting surface of the substrate and a second surface having a sensitization area. The chip further includes a plurality of second conductive contacts arranged around the sensitization area and electrically connected to the first conductive contacts of the substrate. The optical assembly is coupled to the second surface of the chip and disposed above the sensitization area of the chip so as to cover the sensitization area and thereby form an air cavity. In addition, the optical assembly has a predetermined focal length. The encapsulation compound is formed to surround the chip and the optical assembly.

Implementation of the present invention at least involves the following inventive steps:

1. According to the present invention, the pressure applied during a molding process is conveyed to the assembled and tested optical assembly to produce a leveling effect. Thus, the inclination of the optical assembly relative to the chip is reduced to ensure that the Optical focal length is precisely positioned on the sensitization area.

2. The optical assembly is assembled and tested beforehand. Therefore, an otherwise necessary focus adjusting procedure can be spared to simplify the manufacturing process of the image sensor packaging structure.

3. The image sensor packaging structure can be made by a molding process, thereby shortening the cycle time of the manufacturing process and enhancing the throughput per unit time. Consequently, the time and costs of the manufacturing process are reduced.

4. As the image sensor packaging structure can be formed by a molding process, batch-type mass-production is applicable to cut the production costs of the image sensor packaging structure.

5. The image sensor packaging structure is lightweight and compact, thus meeting the demands of handheld products nowadays.

The features and advantages of the present invention are detailed hereinafter with reference to the preferred embodiments. The detailed description is intended to enable a person skilled in the art to gain insight into the technical contents disclosed herein and implement the present invention accordingly. In particular, a person skilled in the art can easily understand the objects and advantages of the present invention by referring to the disclosure of the specification, the claims, and the accompanying drawings.

DETAILED DESCRIPTION OF THE INVENTION

Figure 2:
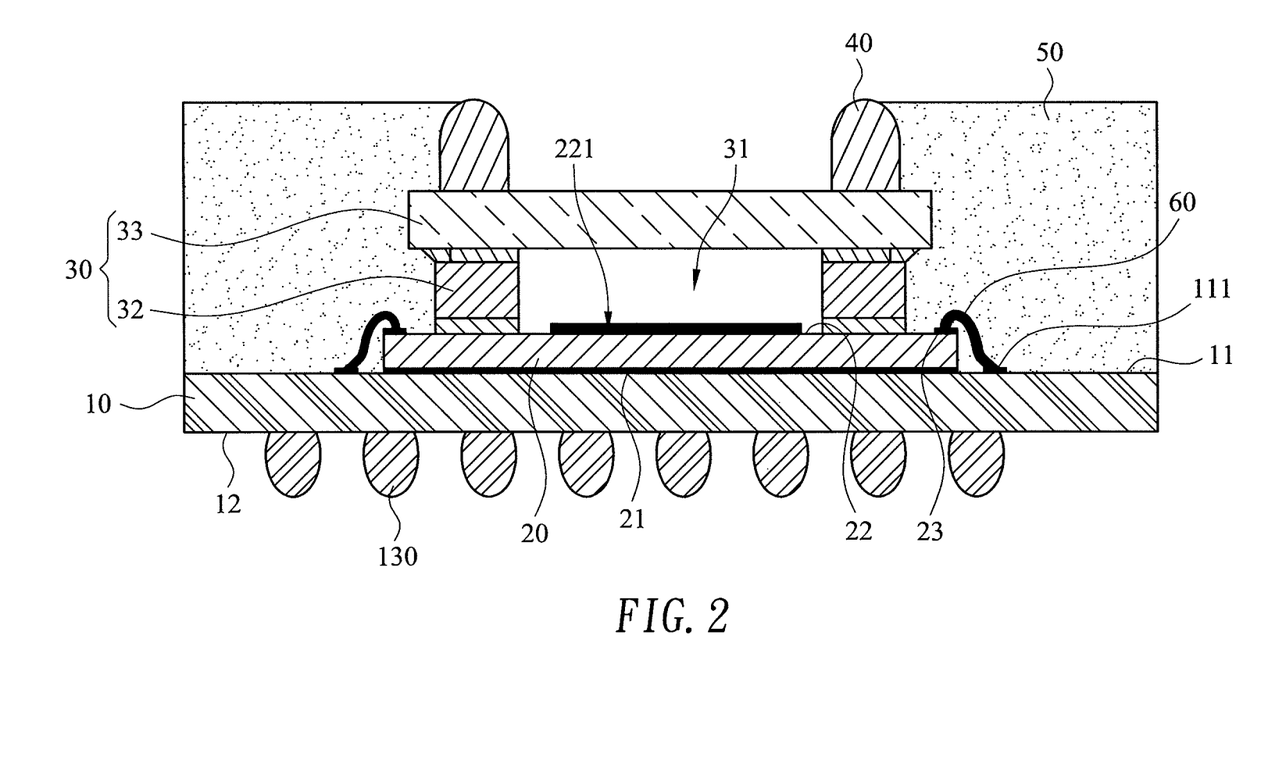
FIG. 2 is a sectional view of an image sensor packaging structure with a predetermined focal length according to a first embodiment of the present invention.
Figure 3:
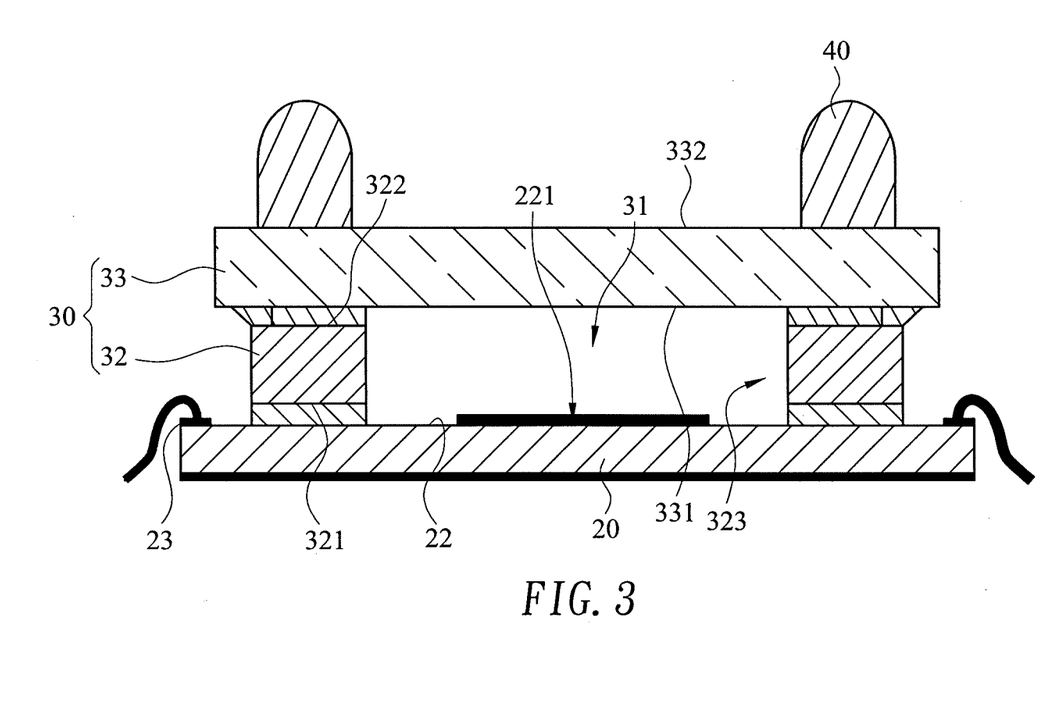
FIG. 3 is a partial enlarged view of FIG. 2.

Referring to FIG. 2 and FIG. 3, an image sensor packaging structure with a predetermined focal length according to a first embodiment of the present invention includes a substrate 10, a chip 20, an optical assembly 30, and an encapsulation compound 50. The encapsulation compound 50 is formed on the substrate 10 by a dispensing process so as to surround the chip 20 and the optical assembly 30. Alternatively, the image sensor packaging structure additionally includes at least one dam 40 provided around the perimeter of a top surface of the optical assembly 30, and the encapsulation compound 50 is formed on the substrate 10 by a molding process so as to surround the chip 20, the optical assembly 30, and the at least one dam 40.

The following paragraphs are dedicated to embodiments which are provided with the at least one dam 40 that allows the encapsulation compound 50 to be formed by molding process. Embodiments in which the encapsulation compound 50 is formed by a dispensing process are described further below.

As shown in FIG. 2, the substrate 10 is a circuitized substrate and has a supporting surface 11 and a bottom surface 12. A plurality of first conductive contacts 111 are formed on the supporting surface 11.

The chip 20 is a complementary metal oxide semiconductor (CMOS) image sensor chip or a charge-coupled device (CCD). The chip 20 has a first surface 21 and a second surface 22, wherein the first surface 21 is coupled to the supporting surface 11 of the substrate 10. The coupling between the chip 20 and the supporting surface 11 can be achieved by bonding or any other means. The second surface 22 of the chip 20 has a sensitization area 221 and is provided with a plurality of second conductive contacts 23, wherein the sensitization area 221 is composed of a plurality of photosensitive elements. The second conductive contacts 23 are arranged around the sensitization area 221 and electrically connected to the first conductive contacts 111 on the substrate 10 by wire bonding with conductive wires 60.

Figure 4:
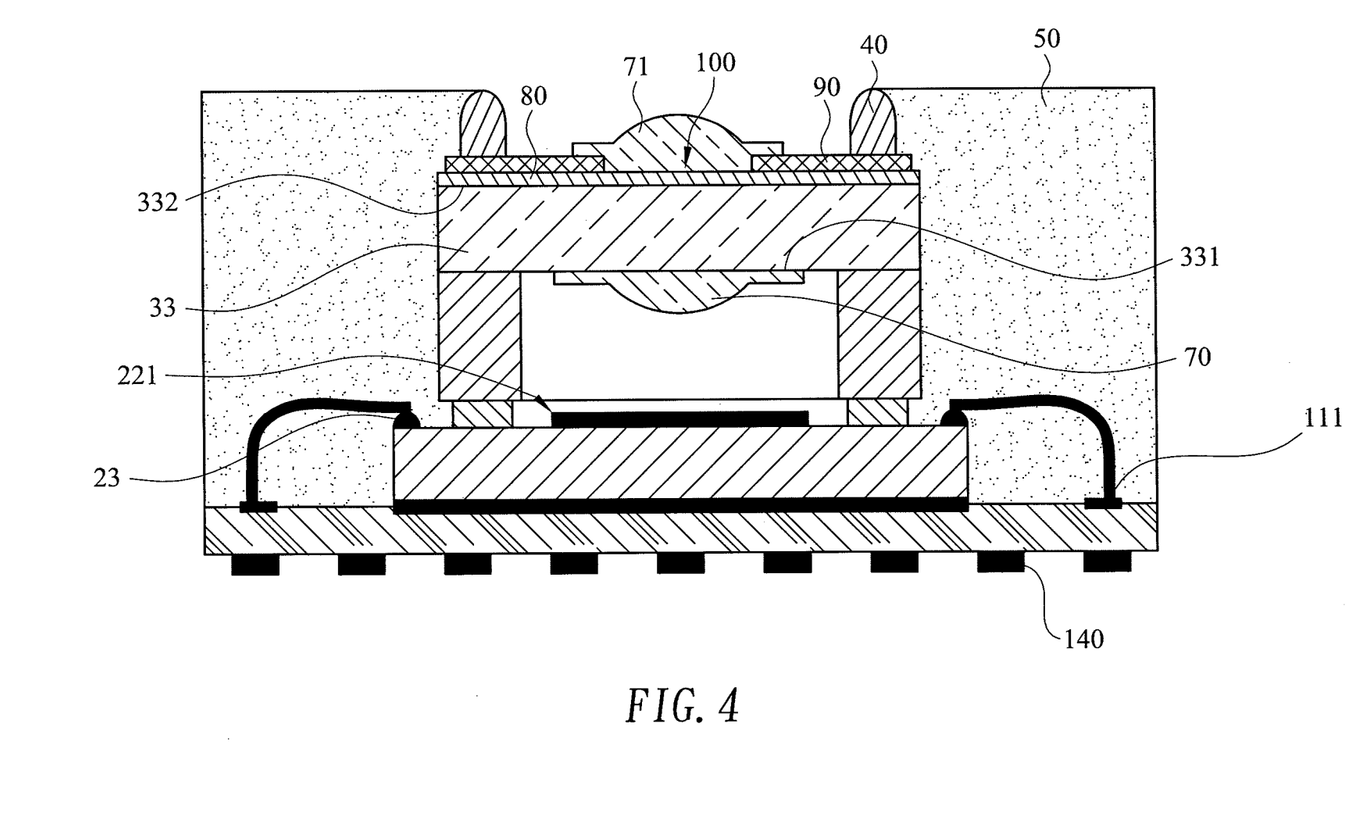
FIG. 4 is a sectional view of an image sensor packaging structure with a predetermined focal length according to a second embodiment of the present invention.

The optical assembly 30 is coupled to the second surface 22 of the chip 20 and located above the sensitization area 221 of the chip 20 so as to cover the sensitization area 221 and form an air cavity 31. The optical assembly 30 is assembled and tested in advance. As shown in FIG. 4, while the optical assembly 30 includes a lens, the optical assembly 30 further has a predetermined focal length.

As shown in FIG. 2 and FIG. 3, the dam 40 is provided around the perimeter of the top surface of the optical assembly 30, thus forming a closed structure on the top surface of the optical assembly 30. The dam 40 is made of epoxy or a film. More specifically, the epoxy or film is provided at a predetermined position and then cured or semi-cured by ultraviolet radiation or baking. Thus, the dam 40 maintains adequate resilience and can be deformed slightly during a subsequent molding process so as to absorb the mold-closing pressure from an upper mold section and block the encapsulation compound 50 outside the dam 40.

After the dam 40 is formed, the semi-product of the image sensor packaging structure is put in a mold (not shown) which includes an upper mold section and a lower mold section. The lower mold section is configured to support and contact with the bottom surface 12 of the substrate 10 while the side wall of the upper mold section is placed on the supporting surface 11 of the substrate 10 such that the supporting surface 11 and the bottom surface 12 of the substrate 10 are clamped between the upper and lower mold sections. In addition, the upper mold section has an inner upper surface which is formed as a flat surface and contacts with a top surface of the dam 40. Thus, the upper and lower mold sections jointly form a mold cavity therebetween.

Finally, the encapsulation compound 50 is filled into the mold cavity and formed on the substrate 10 by molding process. As a result, the encapsulation compound 50 embeds the conductive wires 60 and surrounds the chip 20, the optical assembly 30, and the dam 40. Since the dam 40, together with the optical assembly 30 and the upper mold section, forms a barrier wall, the encapsulation compound 50 is blocked outside the dam 40 and the barrier wall can prevent the encapsulation compound 50 from overflowing to the optical assembly 30.

Referring to FIG. 2 in conjunction with FIG. 3, the optical assembly 30 includes a first supporting frame 32 and a first light-transparent lid 33. The first supporting frame 32 has a third surface 321 and a fourth surface 322. The third surface 321 of the first supporting frame 32 is coupled to the second surface 22 of the chip 20 between the sensitization area 221 and the second conductive contacts 23. In addition, a first opening 323 is defined in the first supporting frame 32 and corresponds in position to the sensitization area 221. On the other hand, the first light-transparent lid 33 has a fifth surface 331 and a sixth surface 332, wherein the fifth surface 331 is coupled to the fourth surface 322 of the first supporting frame 32. The dam 40 is provided around the perimeter of the sixth surface 332 of the first light-transparent lid 33.

As shown in FIG. 2, the present embodiment further includes a plurality of solder balls 130 provided on the bottom surface 12 of the substrate 10. The solder balls 130 are electrically connected to the first conductive contacts 111 via a circuit structure in the substrate 10, thus allowing electrical connection between the image sensor packaging structure and other circuit devices.

Referring to FIG. 4, an image sensor packaging structure with a predetermined focal length according to a second embodiment of the present invention further includes a first lens 70 and a second lens 71. The first lens 70 and the second lens 71 are coupled to the fifth surface 331 and the sixth surface 332 of the first light-transparent lid 33, respectively. At least one of the first lens 70 and the second lens 71 is an aspherical lens, and each of the first lens 70 and the second lens 71 can be a spherical lens or an aspherical lens. Moreover, an infrared filter layer 80 is provided between the second lens 71 and the sixth surface 332 of the first light-transparent lid 33, and a first light-shielding layer 90 can be further provided on the infrared filter layer 80. The first light-shielding layer 90 is formed with a first window 100 corresponding in position to the second lens 71.

Alternatively, the infrared filter layer 80 is provided between the first lens 70 and the fifth surface 331 of the first light-transparent lid 33 (not shown), rather than between the second lens 71 and the sixth surface 332 of the first light-transparent lid 33. However, regardless of where the infrared filter layer 80 is located, there can only be one single-sided infrared filter layer 80. While the infrared filter layer 80 is provided between the first lens 70 and the fifth surface 331, the first light-shielding layer 90 can be provided on the infrared filter layer 80. In this case, the first window 100 of the first light-shielding layer 90 corresponds in position to the first lens 70. As shown in FIG. 4, the second embodiment further includes a plurality of solder pads 140 provided around the perimeter of the bottom surface 12 of the substrate 10 or arranged in an array (not shown). The solder pads 140 are electrically connected to the first conductive contacts 111 via the circuit structure in the substrate 10.

Figure 5:
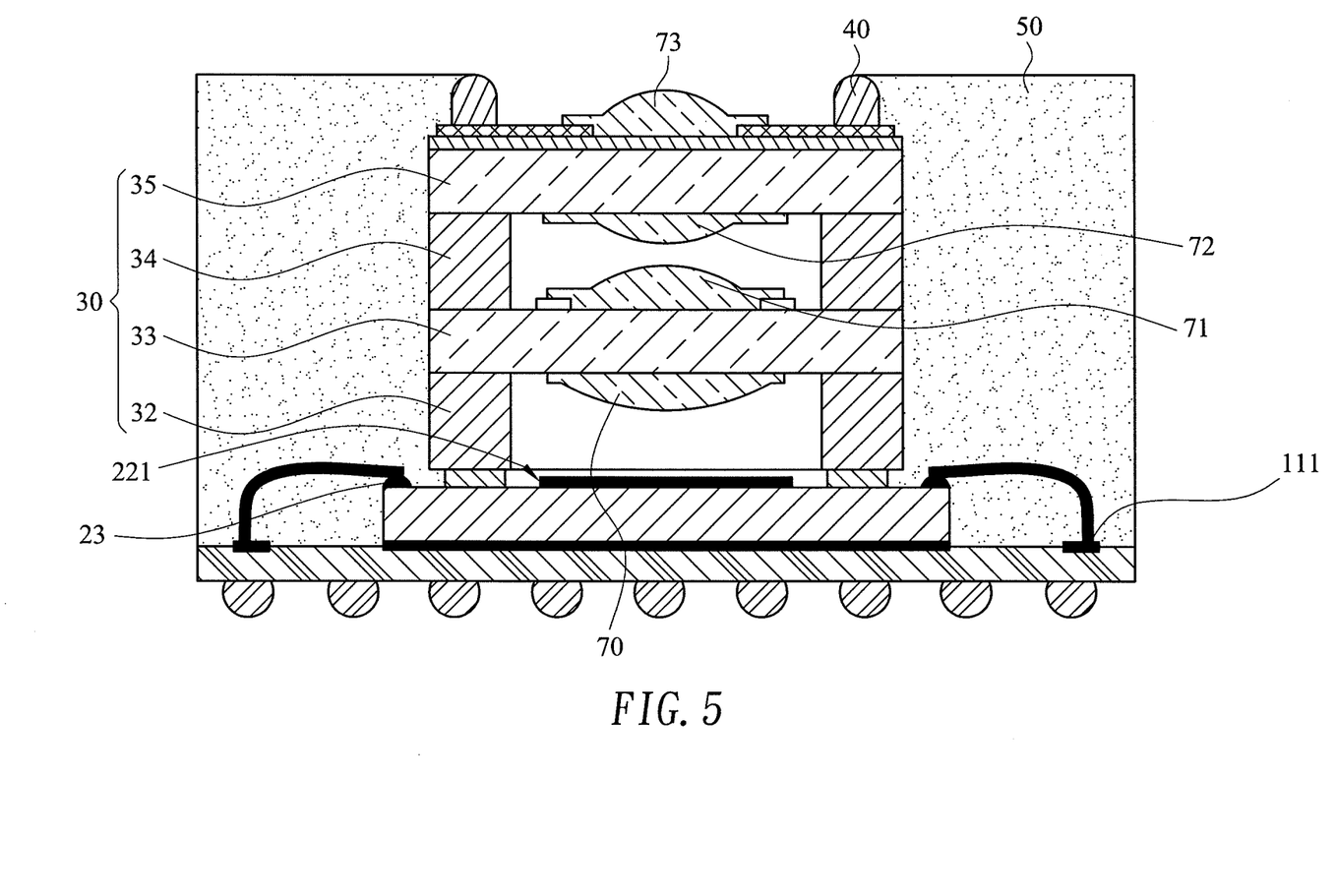
FIG. 5 is a sectional view of an image sensor packaging structure with a predetermined focal length according to a third embodiment of the present invention.
Figure 6:
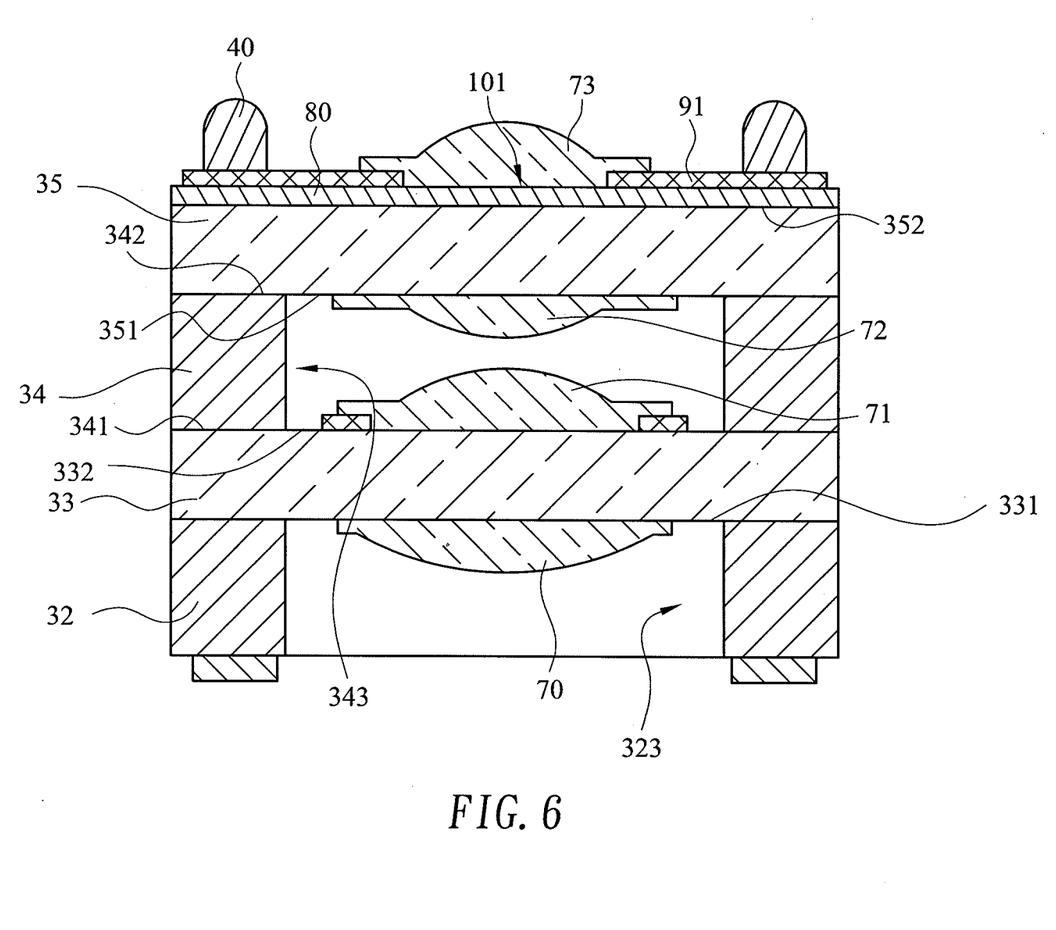
FIG. 6 is a partial enlarged view of FIG. 5.

Referring to FIG. 5 and FIG. 6, in a third embodiment, the optical assembly 30 includes a second supporting frame 34, a second light-transparent lid 35, a third lens 72, and a fourth lens 73, in addition to the first supporting frame 32, the first light-transparent lid 33, the first lens 70, and the second lens 71. The second supporting frame 34 has a seventh surface 341 and an eighth surface 342, wherein the seventh surface 341 is coupled to the sixth surface 332 of the first light-transparent lid 33. Furthermore, the second supporting frame 34 defines therein a second opening 343 that corresponds in position to the first opening 323 of the first supporting frame 32. The first lens 70, the second lens 71, the third lens 72, and the fourth lens 73 can be either spherical or aspherical lenses, but at least one of them must be an aspherical lens.

The second light-transparent lid 35 has a ninth surface 351 and a tenth surface 352, wherein the ninth surface 351 is coupled to the eighth surface 342 of the second supporting frame 34. Besides, the third lens 72 is coupled to the ninth surface 351 of the second light-transparent lid 35 while the fourth lens 73 is coupled to the tenth surface 352 of the second light-transparent lid 35. Moreover, an infrared filter layer 80 is provided between the fourth lens 73 and the tenth surface 352, and a second light-shielding layer 91 can be further provided on the infrared filter layer 80, wherein the second light-shielding layer 91 is formed with a second window 101 that corresponds in position to the fourth lens 73.

The dam 40 is formed around the perimeter of the tenth surface 352. While the infrared filter layer 80 and/or the second light-shielding layer 91 is provided on the tenth surface 352, the dam 40 can be formed on the infrared filter layer 80 (not shown) or the second light-shielding layer 91 (as shown in FIG. 5 and FIG. 6). Alternatively, like the second embodiment, the third embodiment may be configured in such a way that the infrared filter layer 80 is provided between the third lens 72 and the ninth surface 351 while the second light-shielding layer 91 is provided on the infrared filter layer 80. Moreover, the second window 101 of the second light-shielding layer 91 corresponds in position to the third lens 72. In another alternative, the second light-shielding layer 91 is provided around the perimeter of the tenth surface 352, wherein the second window 101 of the second light-shielding layer 91 corresponds in position to the fourth lens 73.

Figure 7:
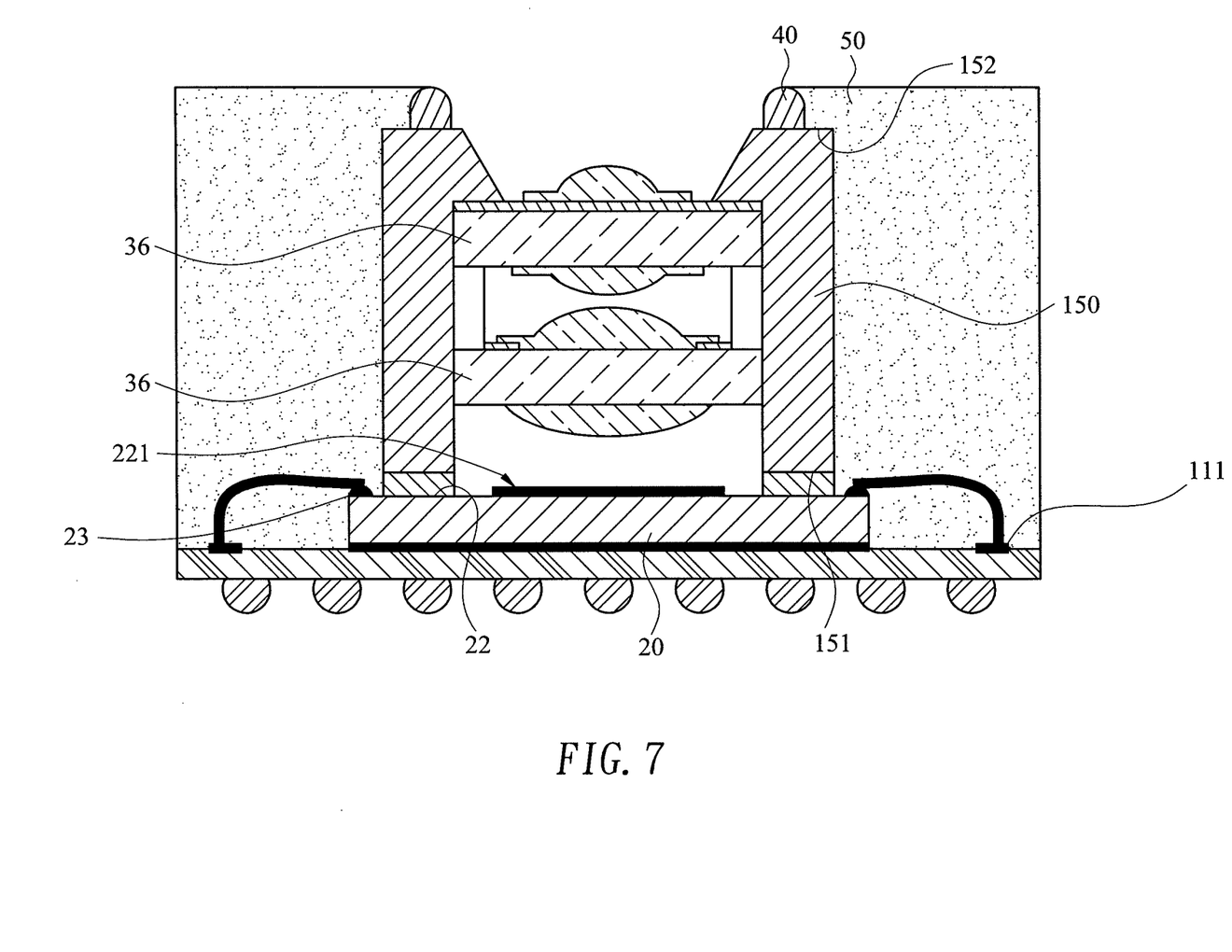
FIG. 7 is a sectional view of an image sensor packaging structure with a predetermined focal length according to a fourth embodiment of the present invention.
Figure 8:
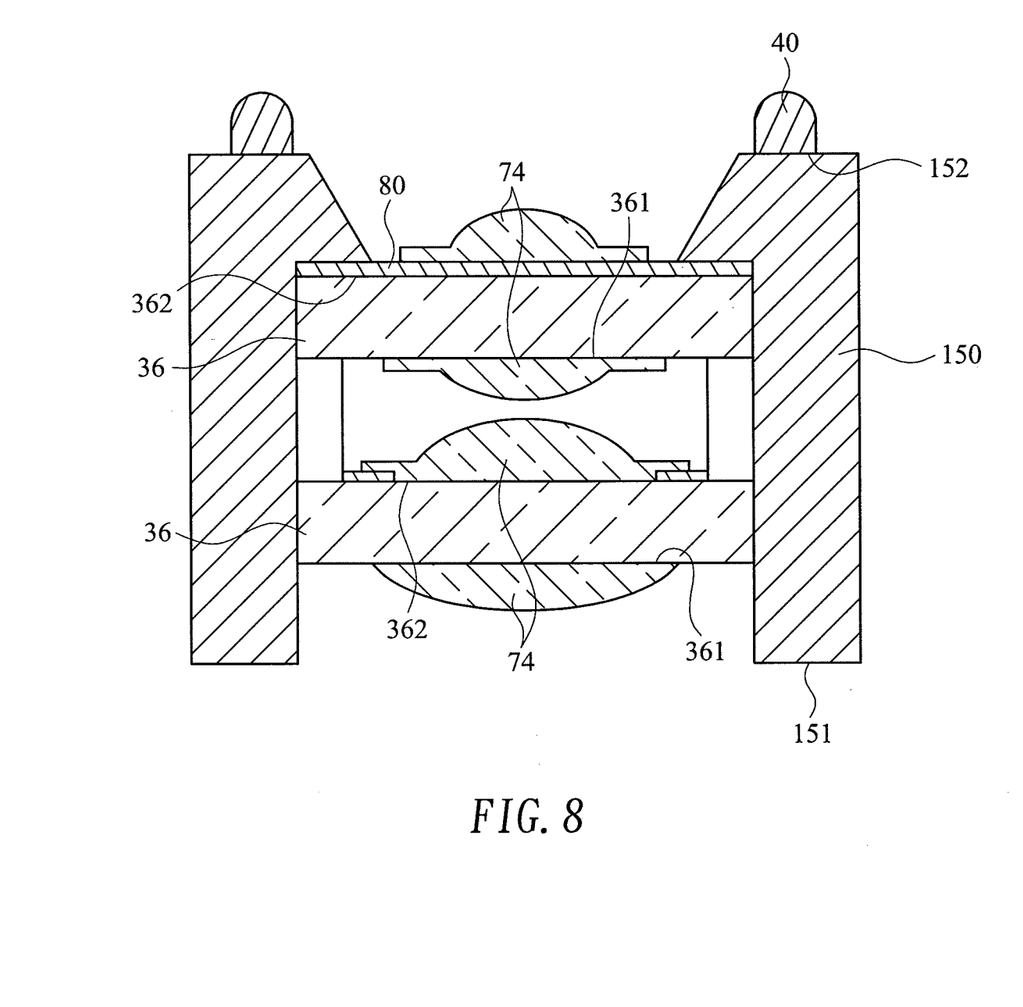
FIG. 8 is a partial enlarged view of FIG. 7.

In a fourth embodiment of the present invention as shown in FIG. 7 and FIG. 8, the optical assembly 30 includes a lens barrel 150, at least one third light-transparent lid 36, and at least two fifth lenses 74. The lens barrel 150 has a bottom surface 151 and a top surface 152, wherein the bottom surface 151 is coupled to the second surface 22 of the chip 20 between the sensitization area 221 and the second conductive contacts 23. In addition, the dam 40 is formed around a perimeter of the top surface 152 of the lens barrel 150.

The third light-transparent lids 36 are fixedly provided in the lens barrel 150. Each third light-transparent lid 36 has an eleventh surface 361 and a twelfth surface 362. The fifth lenses 74 are coupled to the eleventh surfaces 361 and the twelfth surfaces 362, respectively. An infrared filter layer 80 is provided between one of the fifth lenses 74 and the corresponding twelfth surface 362. Alternatively, as in the previous embodiments, the infrared filter layer 80 is provided between one of the fifth lenses 74 and the corresponding eleventh surface 361 (not shown), rather than between one of the fifth lenses 74 and the corresponding twelfth surface 362. However, no matter where the infrared filter layer 80 is located, there can only be one single-sided infrared filter layer 80.

Figure 9:
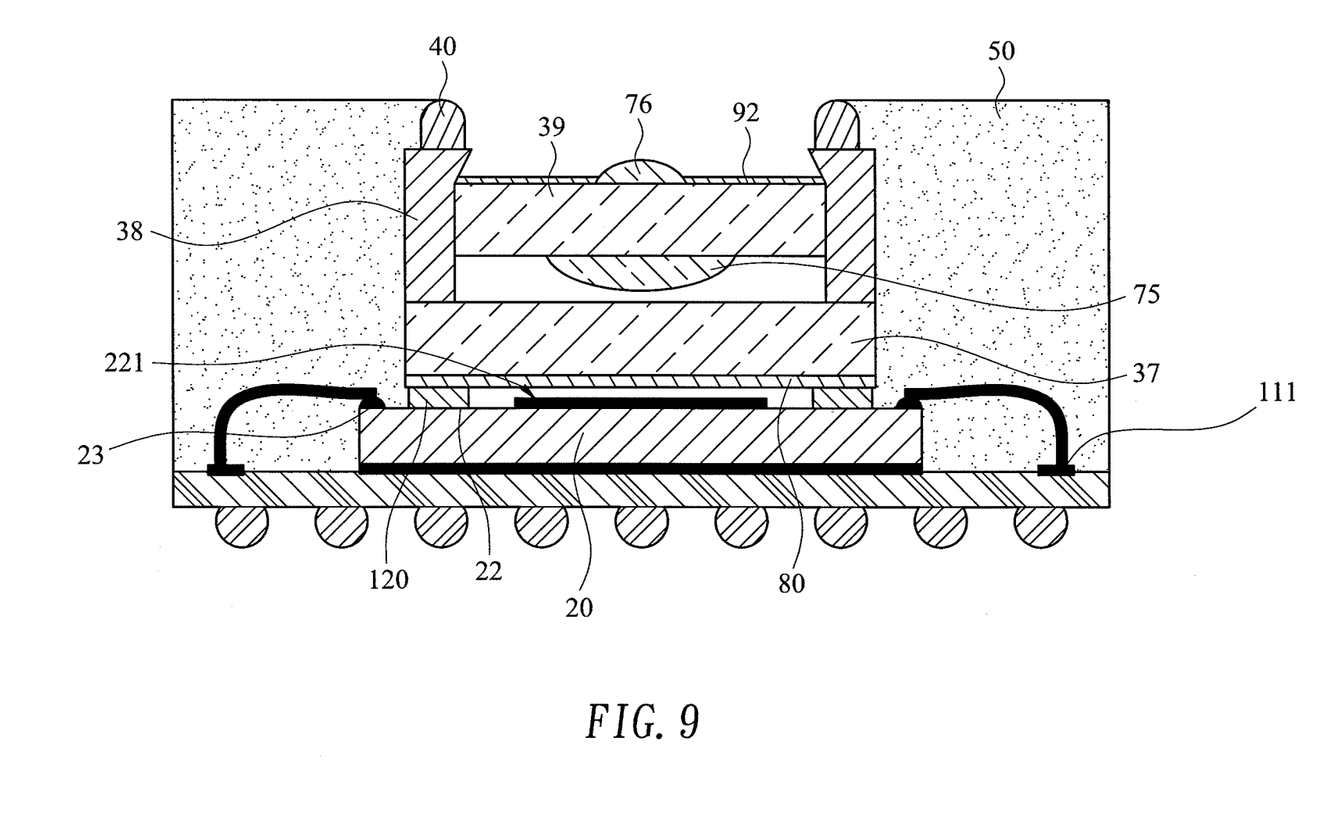
FIG. 9 is a sectional view of an image sensor packaging structure with a predetermined focal length according to a fifth embodiment of the present invention.
Figure 10:
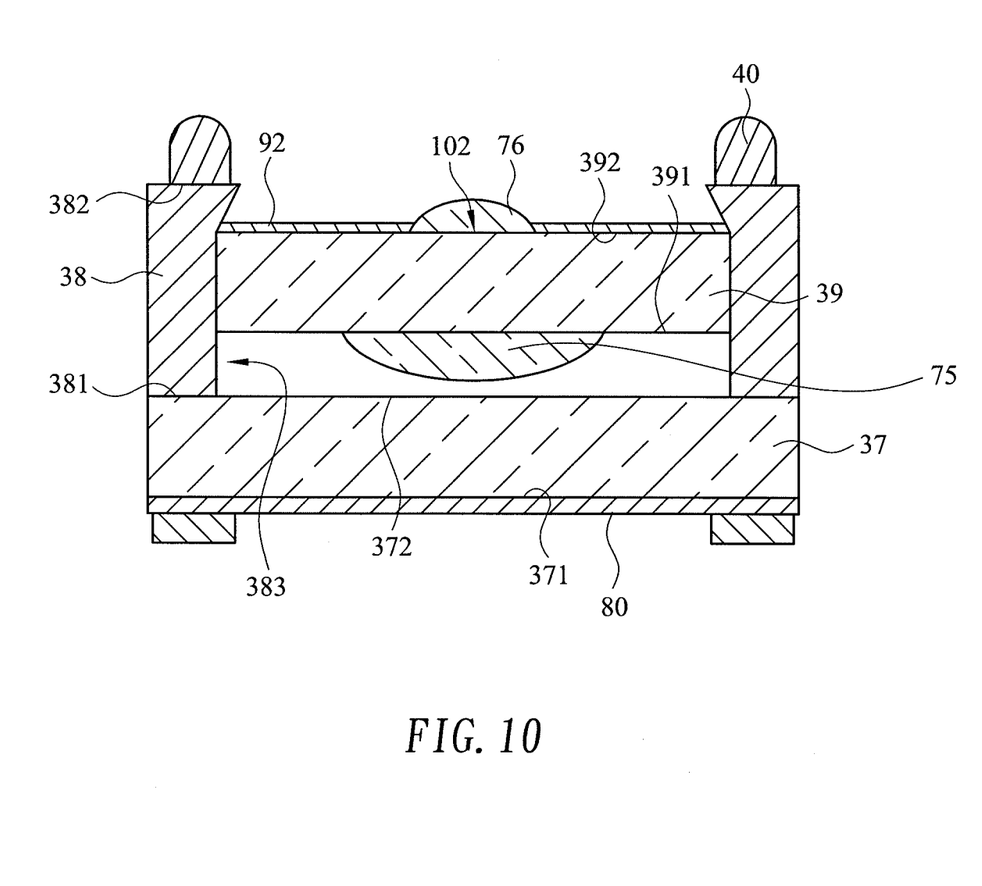
FIG. 10 is a partial enlarged view of FIG. 9.
Figure 11A:
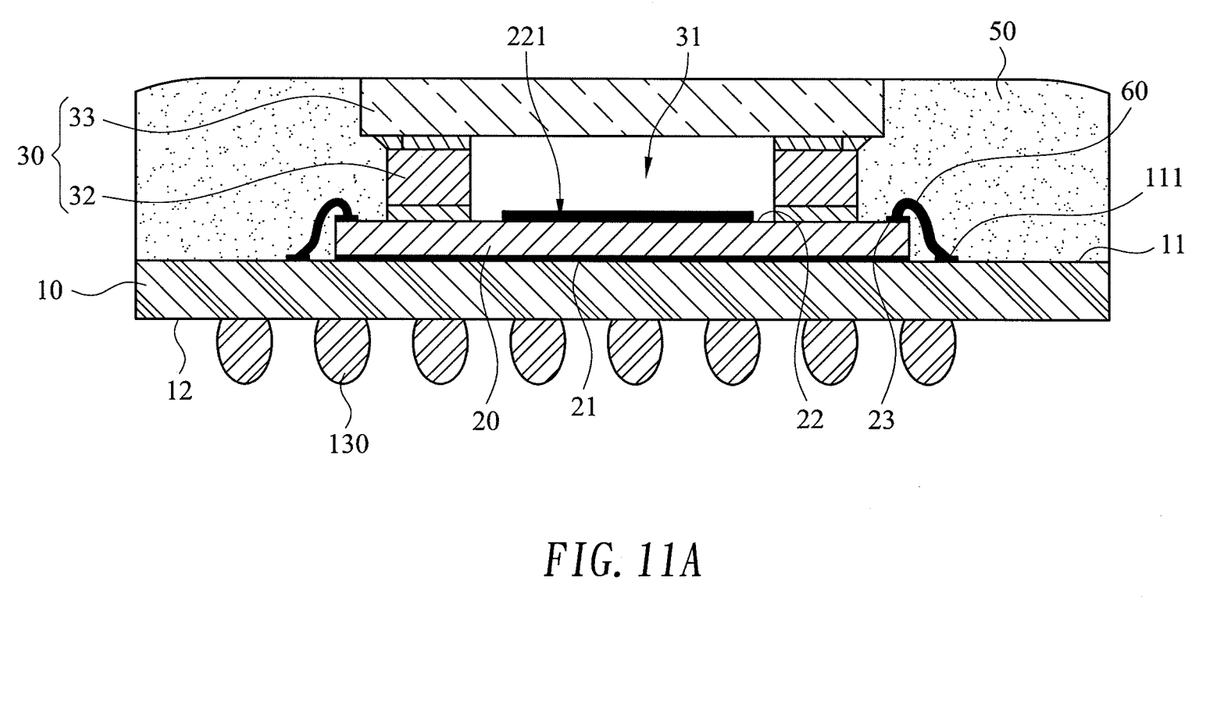
FIG. 11A to FIG. 11D are sectional views of image sensor packaging structures with a predetermined focal length according to the present invention, wherein encapsulation compounds are formed on their respective substrates by a dispensing process.
Figure 11B:
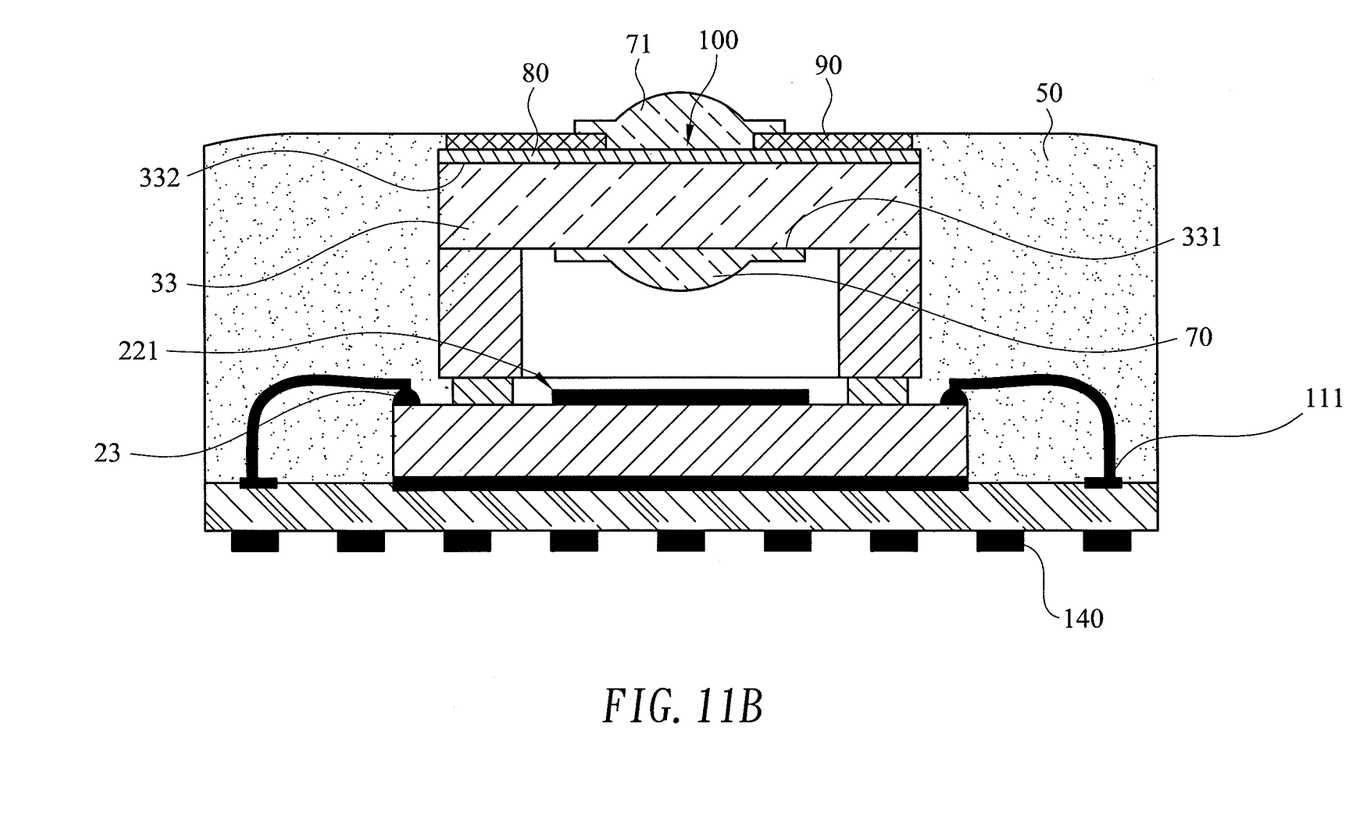
Figure 11C:
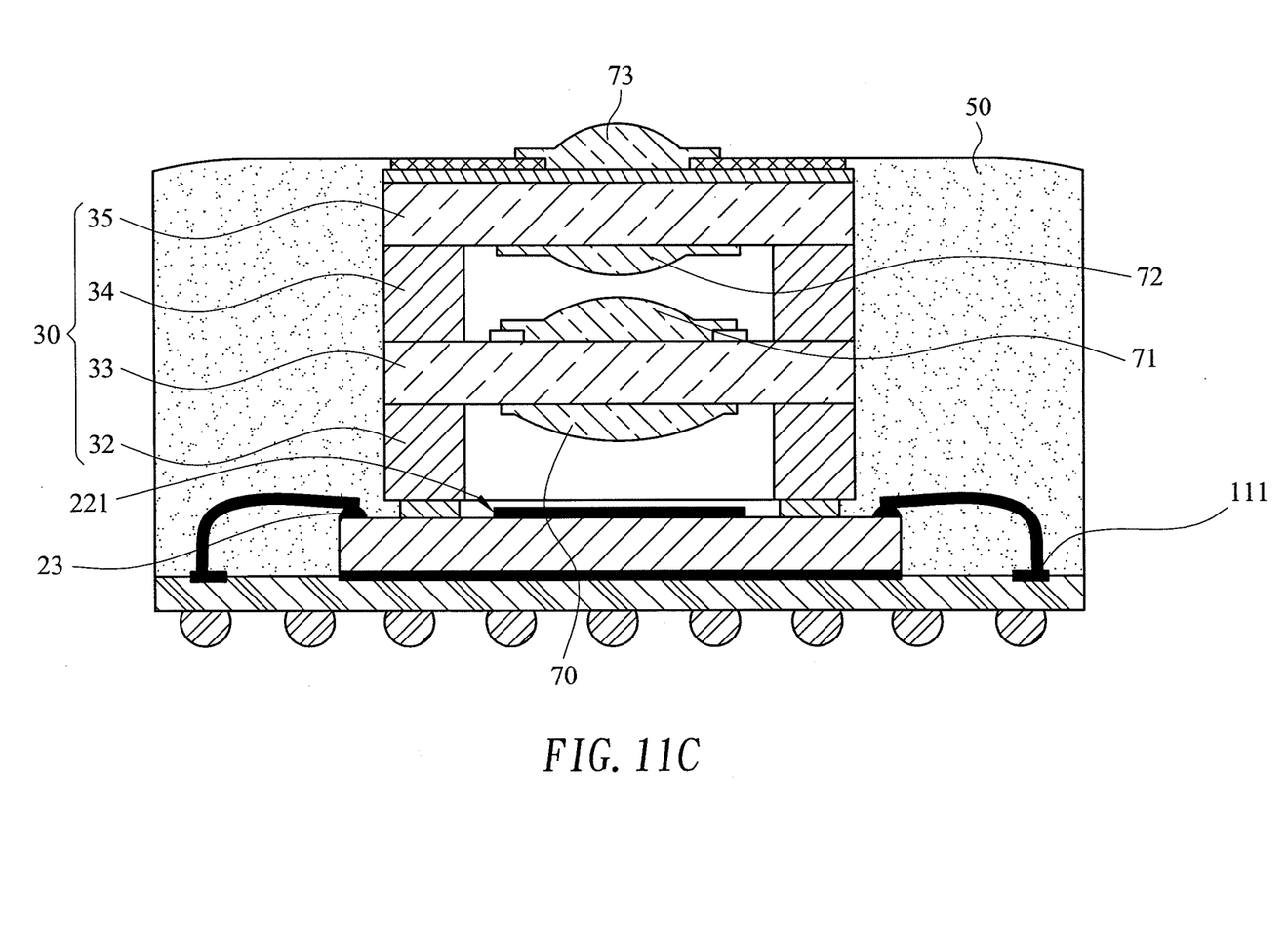
Figure 11D:
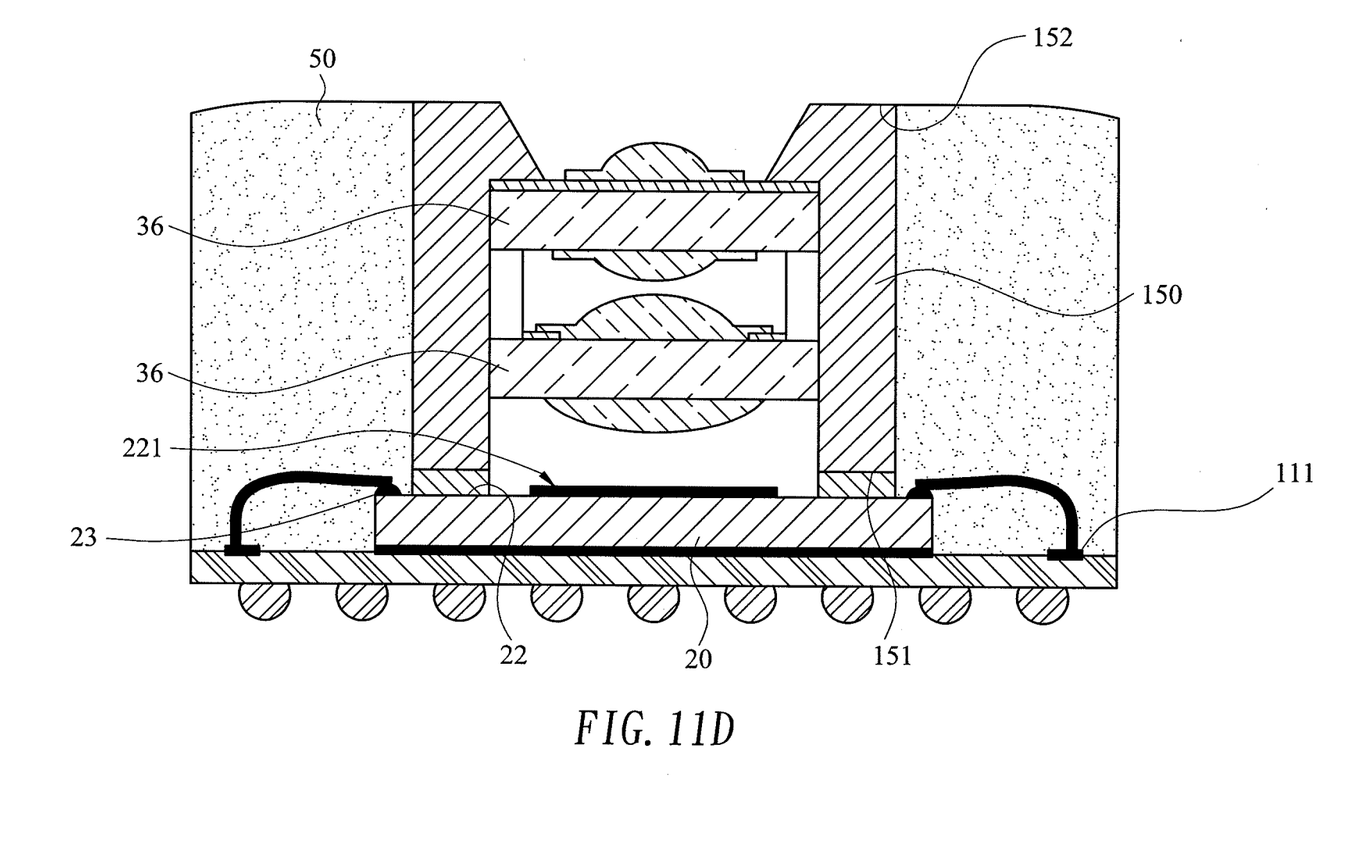

Referring to FIG. 9 and FIG. 10, in a fifth embodiment, the optical assembly 30 includes a fourth light-transparent lid 37, a third supporting frame 38, a fifth light-transparent lid 39, a sixth lens 75, and a seventh lens 76. The fourth light-transparent lid 37 has a thirteenth surface 371 and a fourteenth surface 372. The fourth light-transparent lid 37 is peripherally coupled to the second surface 22 of the chip 20 via the thirteenth surface 371 and an adhesive layer 120, wherein the adhesive layer 120 is located between the sensitization area 221 and the second conductive contacts 23. Further, an infrared filter layer 80 is provided on the thirteenth surface 371.

The third supporting frame 38 has a fifteenth surface 381 and a sixteenth surface 382, wherein the fifteenth surface 381 is coupled to the fourteenth surface 372. Also, the third supporting frame 38 defines therein a third opening 383 that corresponds in position to the sensitization area 221 of the chip 20. Moreover, the dam 40 is formed around a perimeter of the sixteenth surface 382. The fifth light-transparent lid 39, which has a seventeenth surface 391 and an eighteenth surface 392, is fixedly provided in the third opening 383 and fixed to the third supporting frame 38. As shown in FIG. 9 and FIG. 10, the sixth lens 75 is coupled to the seventeenth surface 391 while the seventh lens 76 is coupled to the eighteenth surface 392. Furthermore, a third light-shielding layer 92 is provided on the eighteenth surface 392 and formed with a third window 102 that corresponds in position to the seventh lens 76.

It can be known from the description of the foregoing embodiments that the optical assembly 30 is assembled and tested in advance and therefore does not require a focus adjusting procedure. In consequence, the manufacturing process is simplified, and the costs of equipment, man power, and materials are substantially reduced. Apart from that, the encapsulation compound 50 can be formed by transfer molding regardless of the configuration of the image sensor packaging structure, thus significantly shortening the cycle time of the manufacturing process and increasing the throughput per unit time while lowering related costs indirectly.

Additionally, as the encapsulation compound 50 is formed with a mold during transfer molding, it is necessary to subject the mold to a certain pressure. The dam 40, which is provided between the mold and the optical assembly 30 and stays adequately resilient, not only functions as a buffer between the mold and the optical assembly 30 to prevent the optical assembly 30 from damage, but also conveys the pressure to the assembled and tested optical assembly 30, thus providing a leveling effect, by which the inclination of the optical assembly 30 relative to the chip 20 is reduced. In consequence, the optical focal length of the optical assembly 30 is then more readily positioned on the sensitization area 221 of the chip 20.

Even more advantageously, the dam 40 provided around the perimeter of the top surface of the optical assembly 30 serves as a barrier wall between the optical assembly 30 and the upper mold section. Due to the dam 40, the encapsulation compound 50 is blocked outside the optical assembly 30 and kept the encapsulation compound 50 from overflowing to the optical assembly 30. Further, as the upper mold section is in direct and close contact with the dam 40, the upper mold section does not make direct contact with the optical assembly 30 and is therefore prevented from damaging or causing surface contamination to the optical assembly 30.

In addition to being formed by molding process, the encapsulation compound 50 may also be formed on the substrate 10 by a dispensing process. When the dispensing process is adopted, it is no longer necessary to provide the at least one dam 40 on the optical assembly 30, and yet the optical assembly 30 may still take on the various aspects described above. As shown in FIGS. 11A through 11D, the encapsulation compounds 50 are formed on their respective substrates 10 by a dispensing process without any dam 40 on the optical assemblies 30. Consequently, the overall heights of the image sensor packaging structures are reduced to effectively downsize the image sensor packaging structures.

The foregoing embodiments are illustrative of the characteristics of the present invention so as to enable a person skilled in the art to understand the contents disclosed herein and implement the present invention accordingly. The embodiments, however, are not intended to restrict the scope of the present invention, which is defined only by the appended claims. Hence, all equivalent modifications and changes which do no depart from the spirit of the present invention should be encompassed by the claims.

What is claimed is:

1. An image sensor packaging structure with a predetermined focal length, comprising:
   a substrate having a supporting surface and a bottom surface, the supporting surface formed with a plurality of first conductive contacts;
   a chip having a first surface coupled to the supporting surface of the substrate and a second surface having a sensitization area, the chip further comprising a plurality of second conductive contacts which are arranged around the sensitization area and are electrically connected to the first conductive contacts of the substrate;
   an optical assembly coupled to the second surface of the chip and disposed above the sensitization area of the chip so as to cover the sensitization area and thus form an air cavity, the optical assembly having a predetermined focal length and comprising:
   a fourth light-transparent lid having a thirteenth surface and a fourteenth surface, the fourth light-transparent lid peripherally coupled to the second surface of the chip via the thirteenth surface and an adhesive layer, the adhesive layer provided between the sensitization area and the second conductive contacts,
   a third supporting frame having a fifteenth surface and a sixteenth surface, the fifteenth surface coupled to the fourteenth surface, the third supporting frame defining therein a third opening corresponding in position to the sensitization area, wherein the at least one dam is provided around a perimeter of the sixteenth surface,
   a fifth light-transparent lid fixedly provided in the third opening, fixed to the third supporting frame, and having a seventeenth surface and an eighteenth surface,
   a sixth lens coupled to the seventeenth surface, and
   a seventh lens coupled to the eighteenth surface;
   at least one dam provided around a perimeter of a top surface of the optical assembly; and
   an encapsulation compound formed to surround the chip and the optical assembly.

2. The image sensor packaging structure of claim 1, wherein the chip is a complementary metal oxide semiconductor (CMOS) image sensor chip or a charge-coupled device (CCD).

3. The image sensor packaging structure of claim 1, wherein the sensitization area is composed of a plurality of photosensitive elements.

4. The image sensor packaging structure of claim 1, wherein the at least one dam is made of epoxy or a film.

* * * * *